US010388327B2

(12) United States Patent
Eguchi et al.

(10) Patent No.: US 10,388,327 B2
(45) Date of Patent: Aug. 20, 2019

(54) FAN NOISE ATTENUATION AT HARD DISK DRIVE IN RACK-MOUNT

(71) Applicant: Western Digital Technologies, Inc., Irvine, CA (US)

(72) Inventors: Takehiko Eguchi, Chuo-ku (JP); Miki Namihisa, Fujisawa (JP); Kazuhide Ichikawa, Fujisawa (JP); Yohei Asai, Fujisawa (JP)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 15/445,128

(22) Filed: Feb. 28, 2017

(65) Prior Publication Data

US 2018/0247677 A1    Aug. 30, 2018

(51) Int. Cl.
| | |
|---|---|
| *G11B 33/00* | (2006.01) |
| *G11B 33/08* | (2006.01) |
| *G11B 33/14* | (2006.01) |
| *H05K 7/20* | (2006.01) |
| *G06F 1/18* | (2006.01) |

(Continued)

(52) U.S. Cl.
CPC .............. *G11B 33/08* (2013.01); *G06F 1/182* (2013.01); *G06F 1/187* (2013.01); *G06F 1/20* (2013.01); *G11B 33/128* (2013.01); *G11B 33/142* (2013.01); *H05K 7/20727* (2013.01); *F04D 25/166* (2013.01); *F04D 29/664* (2013.01)

(58) Field of Classification Search
CPC ..... H05K 7/20727; G06F 1/182; G06F 1/187; G06F 1/20; G11B 33/128; G11B 33/142
See application file for complete search history.

(56) References Cited

U.S. PATENT DOCUMENTS

| | | |
|---|---|---|
| 6,473,297 B1 | 10/2002 | Behl et al. |
| 6,906,918 B2 | 6/2005 | Rabinovitz |

(Continued)

FOREIGN PATENT DOCUMENTS

| | | |
|---|---|---|
| TW | 200736928 A | 10/2007 |
| WO | WO2009116647 A1 | 9/2009 |

OTHER PUBLICATIONS

Fujitsu, Primergy Feature Story—Cool and Efficient, downloaded from http://www.fujitsu.com/global/products/computing/servers/primergy/featurestories/fs06-green-coolandefficient.html on Nov. 21, 2016, 5 pages.

(Continued)

*Primary Examiner* — Binh B Tran
*Assistant Examiner* — Douglas R Burtner
(74) *Attorney, Agent, or Firm* — John D. Henkhaus (57) ABSTRACT

A sound-attenuation part, such as for use in a rack-mount server, is configured for insertion into an orifice of a backplane to which at least one data storage device is coupled. The sound-attenuation part may include one or more pipes extending from a mounting portion. The sound-attenuation part helps to attenuate acoustic noise, such as from a cooling fan, which might otherwise reach the data storage device, such as through airflow orifices constituent to a backplane that is positioned between the fan and the storage device, while maintaining enough airflow through the backplane for system cooling purposes. Thus, degradation of the head positioning accuracy within the storage device, caused by the forces associated with this acoustic noise, may be reduced.

19 Claims, 5 Drawing Sheets

(51) Int. Cl.
  *G06F 1/20*   (2006.01)
  *G11B 33/12*  (2006.01)
  *F04D 29/66*      (2006.01)
  *F04D 25/16*      (2006.01)

(56) References Cited

U.S. PATENT DOCUMENTS

| | | | |
|---|---|---|---|
| 6,954,329 B1* | 10/2005 | Ojeda | G11B 25/043 |
| | | | 360/97.19 |
| 6,958,884 B1* | 10/2005 | Ojeda | G11B 25/043 |
| | | | 360/97.19 |
| 7,643,285 B2 | 1/2010 | Nishiyama et al. | |
| 7,783,055 B2 | 8/2010 | Barath et al. | |
| 8,427,835 B2 | 4/2013 | Xu et al. | |
| 9,141,156 B2 | 9/2015 | Ross et al. | |
| 9,351,424 B2 | 5/2016 | Facusse et al. | |
| 9,426,932 B2 | 8/2016 | Kinstle et al. | |
| 2006/0120045 A1* | 6/2006 | Van Der Werff | G06F 1/20 |
| | | | 361/697 |
| 2006/0131101 A1* | 6/2006 | Crocker | F04D 29/664 |
| | | | 181/224 |
| 2007/0110255 A1* | 5/2007 | Barath | G10K 11/178 |
| | | | 381/71.5 |
| 2007/0221440 A1* | 9/2007 | Gilliland | F16L 55/0331 |
| | | | 181/202 |
| 2011/0123036 A1* | 5/2011 | Barath | G10K 11/178 |
| | | | 381/71.3 |
| 2014/0167578 A1 | 6/2014 | Lesser et al. | |
| 2016/0037687 A1* | 2/2016 | Stevens | G11B 33/142 |
| | | | 361/679.31 |
| 2016/0298871 A1* | 10/2016 | Gillatt | E04B 1/8218 |
| 2018/0330712 A1* | 11/2018 | Chen | G11B 33/08 |

OTHER PUBLICATIONS

Tyco Fire Protection Products, The impact of sound on computer hard disk drives and risk mitigation measures, Jan. 1, 2016, XP055451389, http://www.hygood.co.uk/Literature/Sound-White-Paper-Data-Center-web.pdf.

European Patent Office, International Search Report and Written Opinion for corresponding PCT/US2017/061634, dated Feb. 27, 2018.

* cited by examiner

FAN NOISE ATTENUATION AT HARD DISK DRIVE IN RACK-MOUNT

FIELD OF EMBODIMENTS

Embodiments may relate generally to data storage devices and, more particularly, to reducing noise at a data storage device housed in a rack-mount.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head that is positioned over a specific location of a disk by an actuator. A read-write head uses a magnetic field to read data from and write data to the surface of a magnetic-recording disk. A write head makes use of the electricity flowing through a coil, which produces a magnetic field. Electrical pulses are sent to the write head, with different patterns of positive and negative currents. The current in the coil of the write head induces a magnetic field across the gap between the head and the magnetic disk, which in turn magnetizes a small area on the recording medium.

Often, one or more HDDs are housed in a system chassis, or "rack-mount", such as in the case of a data storage system, a server system, and the like. However, housing HDDs in a system chassis can have undesirable degrading effects on the operational performance of the HDDs, due to various factors within the environment of the chassis.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY OF EMBODIMENTS

Embodiments of the invention are directed, generally, at a sound-attenuation part, a rack-mount server in which such a sound-attenuation part is installed, and a method of assembling a computing system that utilizes such a sound-attenuation part.

A sound-attenuation part is configured for insertion into an orifice of a backplane, to which at least one data storage device is coupled, for example. Embodiments include a sound-attenuation part that includes one or more pipes extending from a mounting portion. The sound-attenuation part helps to attenuate sound noise, such as from a cooling fan, which may otherwise reach the data storage device, such as through airflow orifices constituent to a backplane that is positioned between the fan and the storage devices, while maintaining enough airflow through the backplane for system cooling purposes. According to embodiments, such a sound-attenuation part may be utilized in a "rack-mount" server or computing system, in which a cooling fan is utilized to cool, primarily, one or more computing processors.

Embodiments discussed in the Summary of Embodiments section are not meant to suggest, describe, or teach all the embodiments discussed herein. Thus, embodiments of the invention may contain additional or different features than those discussed in this section. Furthermore, no limitation, element, property, feature, advantage, attribute, or the like expressed in this section, which is not expressly recited in a claim, limits the scope of any claim in any way.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Approaches to a sound-attenuation part are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of an Illustrative Operating Context

Embodiments may be used in the context of rack-mount server or computing system in which at least one data storage device (DSD) is installed, where the DSD may comprise a hard disk drive (HDD), for example, and use of a sound-attenuating part can mitigate performance degradation associated with the HDD. Thus, in accordance with an embodiment, a plan view illustrating an HDD 100 is shown in FIG. 1 to illustrate an exemplary operating context.

Figure 1:
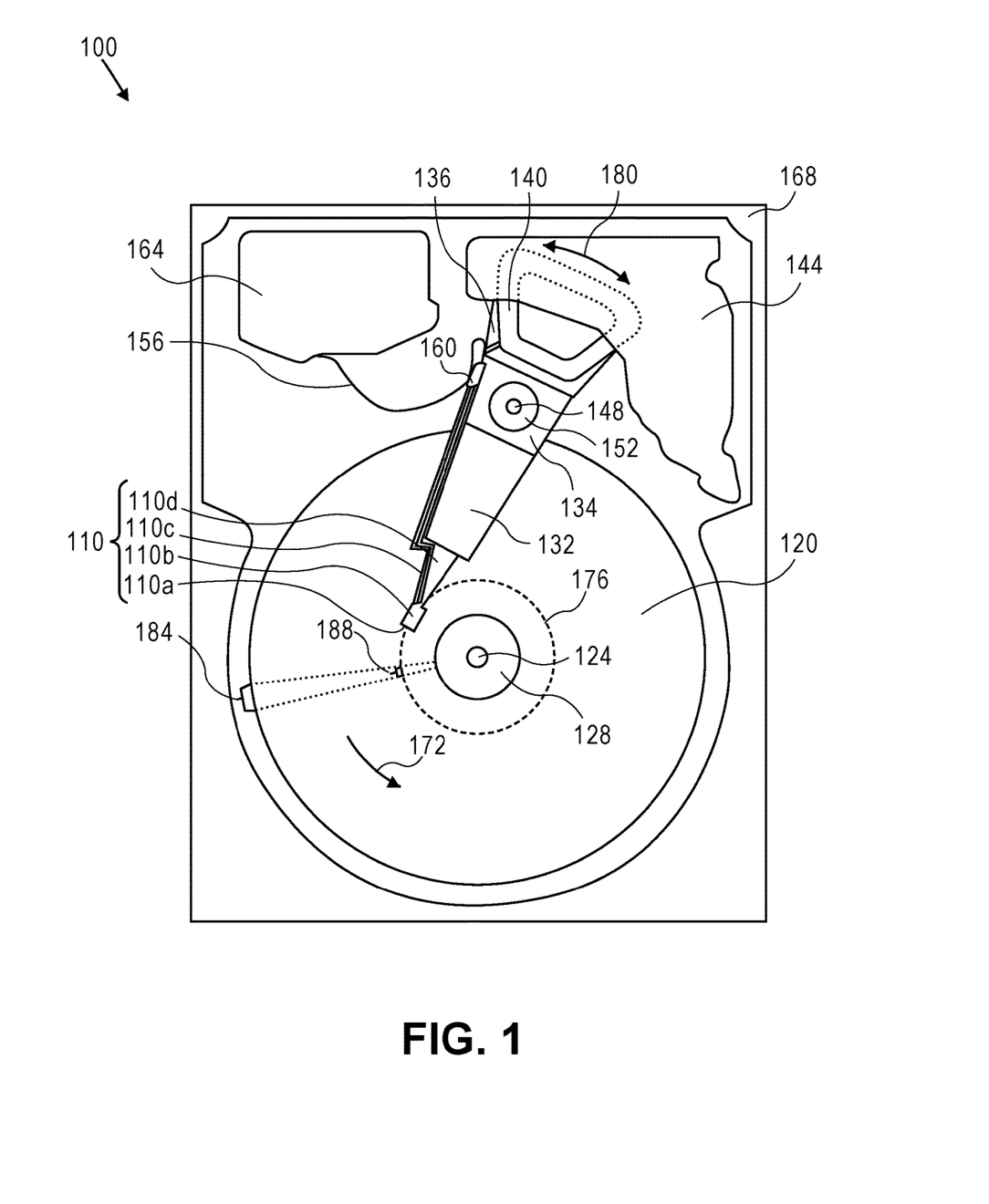
FIG. 1 is a plan view illustrating a hard disk drive (HDD), according to an embodiment.

FIG. 1 illustrates the functional arrangement of components of the HDD 100 including a slider 110*b* that includes a magnetic read-write head 110*a*. Collectively, slider 110*b* and head 110*a* may be referred to as a head slider. The HDD 100 includes at least one head gimbal assembly (HGA) 110 including the head slider, a lead suspension 110*c* attached to the head slider typically via a flexure, and a load beam 110*d* attached to the lead suspension 110*c*. The HDD 100 also includes at least one recording medium 120 rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110a, are transmitted by a flexible cable assembly (FCA) 156 (or "flex cable"). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110a of the HGA 110 reads the servo-burst-signal pattern, which provides a position-error-signal (PES) to the servo electronics, which controls the electrical signal provided to the voice coil 140 of the VCM, thereby enabling the head 110a to follow the track 176. Upon finding the track 176 and identifying a particular sectored track portion 188, the head 110a either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Introduction

If used herein, the term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees.

Figure 2A:
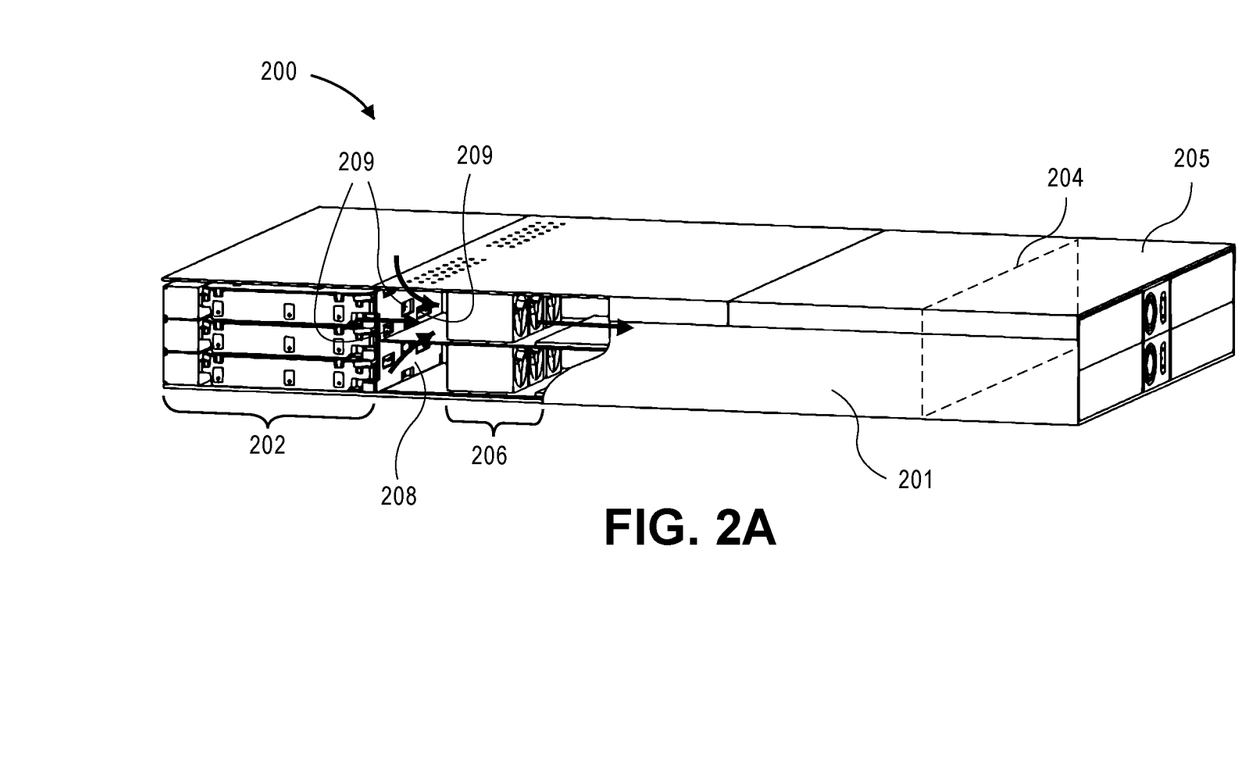
FIG. 2A is a cut-away perspective view illustrating a rack-mount server, according to an embodiment.
Figure 2B:
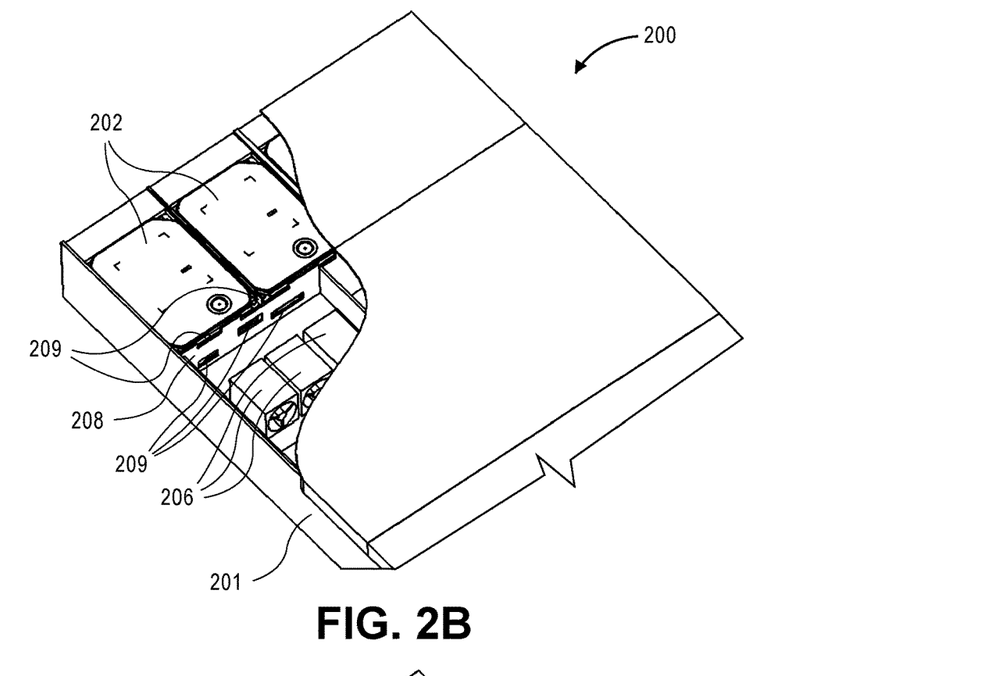
FIG. 2B is another cut-away perspective view illustrating a backplane in the rack-mount server of FIG. 2A, according to an embodiment.

FIG. 2A is a cut-away perspective view illustrating a rack-mount server, and FIG. 2B is another cut-away perspective view illustrating a backplane in the rack-mount server of FIG. 2A, both according to an embodiment. Server 200 is considered a "rack-mount" server, or computing system, configured with a common arrangement of components.

Server 200 comprises a plurality of electronic components mounted in an enclosure 201 (e.g., a rack-mount). According to an embodiment, the electronic components are data storage devices (DSDs) 202. According to an embodiment, the DSDs 202 are hard disk drive (HDD) storage devices and, therefore, may be referred to as HDDs 202. Server 200 further comprises at least one processor, or CPU unit 204 (depicted simply hidden behind a cover 205 in FIG. 2A). Server 200 comprises at least one fan 206 positioned between the DSDs 202 and the CPU unit 204, and is configured for generating airflow for cooling the CPU unit 204, as well as cooling the server 200 generally. A backplane 208 is positioned between the DSDs 202 and the fan 206, where the backplane 208 comprises a plurality of orifices 209 (i.e., holes) for directing the flow of air (depicted by the arrows in FIG. 2A) within the enclosure 201. If suitably configured, the fan 206 may draw air (or a lighter-than-air gas) from the outside of the server 200 through the front of server 200 and thus through the DSD compartment, and through various vent holes that may be constituent to the enclosure 201 and the corresponding covers of the enclosure 201, and circulate the air toward the back of the server 200 and at the CPU unit 204. Backplanes (e.g., a printed circuit board, or "PCB", comprising at least one electrical connector), such as backplane 208, are typically used to communicatively couple with corresponding electronic devices, such as DSDs 202, via a group of one or more electrical connectors, thereby generally serving as a communication bus. Note that the configuration and relative positioning of the components of server 200 may vary from implementation to implementation, and the foregoing represents an example of a common configuration for a server or computing system.

As mentioned, housing HDDs (as one non-limiting type of DSD 202) in a system chassis or enclosure can have undesirable degrading effects on the operational performance of the HDDs, due to various factors within the environment of the chassis. One significant source of HDD 202 performance degradation in this type of environment is the sound generated by operation of the cooling fan 206, and the consequent degradation of the head positioning accuracy within the HDD 202 that is caused by the forces associated with this acoustic noise, which transmit to the HDD 202 through the orifices 209 of backplane 208. When the server 200 is busy, the fan 206 often operates under a heavy load to blow a significant flow of air to the CPU unit 204. Meanwhile, the HDDs 202 do not require such a large amount of airflow for cooling, but the sound noise generated by the fan degrades the performance (e.g., I/O, or input/output) of the HDDs 202. Furthermore, any trend toward higher rotational speed cooling fans (which typically generate more noise), coupled with the trend toward higher TPI (tracks per inch, a measure of areal density) HDDs, would only exacerbate the challenges associated with the acoustic energy and the consequent HDD performance degradation.

Sound-Attenuation Parts

One approach to attenuating the noise from the fan 206 that reaches the bank of DSDs 202 is to isolate the DSDs 202 from the noise to some extent, while maintaining enough airflow through the backplane 208 to cool the DSDs 202 (and CPU unit 204).

Figure 3:
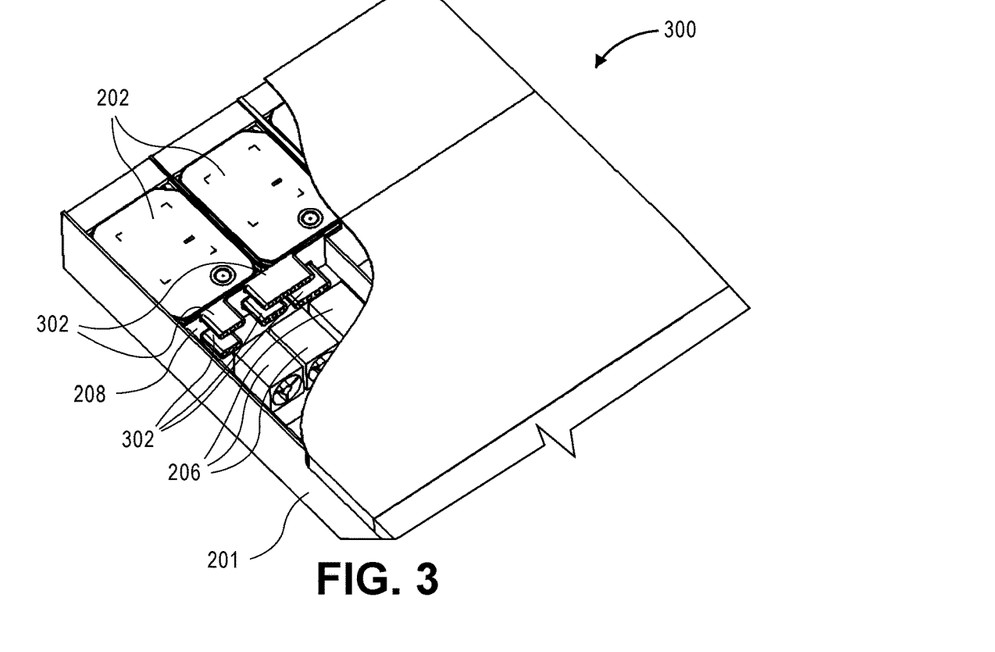
FIG. 3 is a cut-away perspective view illustrating a backplane to which a plurality of sound-attenuation parts is coupled, according to an embodiment.

FIG. 3 is a cut-away perspective view illustrating a backplane to which a plurality of sound-attenuation parts is coupled, according to an embodiment. Server 300 is similar to server 200 (FIGS. 2A, 2B) in that it comprises a plurality of DSDs 202 (or HDDs 202 or, generally, electronic components) mounted in an enclosure 201 (e.g., a rack-mount), at least one processor or CPU unit 204 (not shown here), at least one fan 206 positioned between the DSDs 202 and the CPU unit 204, and a backplane 208 positioned between the DSDs 202 and the fan 206, where the backplane 208 comprises a plurality of orifices 209. However, one feature that is different from server 200 is the presence of at least one sound-attenuation part 302 coupled with a corresponding orifice 209 of the backplane 208. As depicted, and according to an embodiment, the sound-attenuation part(s) 302 comprise an elongated structure that extends from a back side (shown) of the backplane 208 in a direction toward the fan 206. As with server 200, the configuration and relative positioning of the components of server 300 may vary from implementation to implementation, and FIG. 3 represents an example of a common configuration for a server or computing system.

According to an embodiment, a portion of the sound-attenuation part(s) 302 through which air flows has a cross-sectional area that is less than the cross-sectional area of the corresponding orifice 209. Therefore, based at least on the reduction of area through which the fan noise may travel, the sound-attenuation part 302 may function to attenuate the noise that reaches the bank of DSDs 202. Suitably configured, each sound-attenuation part 302, while attenuating the noise therethrough, also permits sufficient airflow through the corresponding orifice 209 to provide sufficient DSD 202 cooling.

Figure 4A:
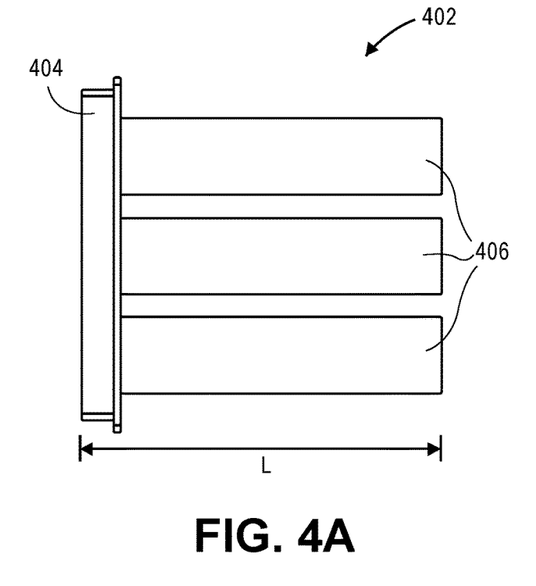
FIG. 4A is a first view illustrating a sound-attenuation part, according to an embodiment.
Figure 4B:
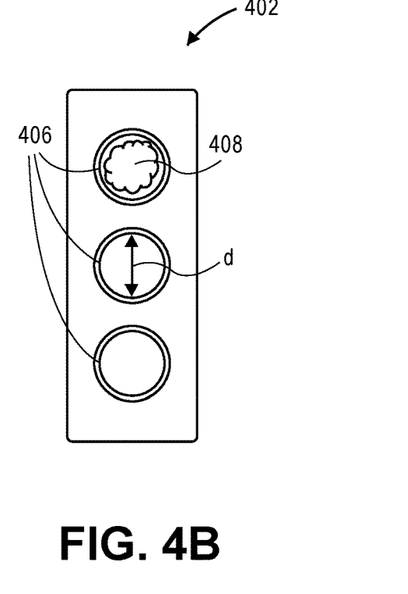
FIG. 4B is a second view illustrating the sound-attenuation part of FIG. 4A, according to an embodiment.

FIG. 4A is a first view illustrating a sound-attenuation part, and FIG. 4B is a second view illustrating the sound-attenuation part of FIG. 4A, both according to embodiments. Sound-attenuation part 402 comprises a mounting portion 404 and one or more pipes 406 that extend from the mounting portion 404. For example, sound-attenuation part 402 represents an embodiment of sound-attenuation part 302 (FIG. 3) of server 300 (FIG. 3). According to an embodiment, the mounting portion 404 is structurally configured to mate with a corresponding orifice 209 (FIGS. 2A, 2B) of backplane 208 (FIGS. 2A, 2B, 3). According to an embodiment, the mounting portion 404 is structurally configured for insertion into a specific corresponding orifice 209. However, the manner in which each sound-attenuation part 402 is configured to couple with a corresponding orifice 209 may vary from implementation to implementation, such that the sound-attenuation part 402 operates to attenuate sound that may reach the set of DSDs 202 (FIGS. 2A, 2B, 3). With reference to FIG. 3 and the configuration of the server 300 depicted therein, note that according to an embodiment, the pipes 406 of sound-attenuation part 402 extend in a direction away from the back of the backplane 208, which is also in the direction away from the DSDs 202, which is in the direction toward the fans 206.

With reference to FIG. 4A, note that each of the pipes 406 of sound-attenuation part 402 has a length (L), which in this depiction includes the portion of pipes 406 within the mounting portion 404 (as shown). For effectiveness, the length (L) of the pipes 406 has a lower limit, with consideration to a shorter length (L) decreasing the sound power reduction. Additionally, the length (L) of the pipes 406 for their intended purpose may have an effective upper limit, at which their sound attenuation effectiveness no longer increases sufficiently as the length (L) increases. Still further, each of the pipes 406 has a resonant frequency, thus consideration of a suitable length (L) for pipes 406 may consider certain frequencies of noise being attenuated, for which a corresponding length (L) (with a corresponding resonant frequency) may be desirable to avoid. According to an embodiment, the length (L) of the pipes 406 is at least 20 mm (millimeters), a length that was found suitable for the intended purpose(s) described herein. Note that embodiments of sound-attenuation part 402 are not limited to pipes 406 having uniform length, as the respective length of each of pipes 406 may differ.

With reference to FIG. 4B, note that each of the pipes 406 of sound-attenuation part 402 has a diameter (d) (e.g., inner diameter). For effectiveness, the diameter (d) of the pipes 406 has a lower limit, with consideration to a smaller diameter (d) increasing the air pressure loss through the pipes 406. According to an embodiment, the diameter (d) of the pipes 406 is at least 2 mm (millimeters), a diameter that was found suitable for the intended purpose(s) described herein. Note that embodiments of sound-attenuation part 402 are not limited to pipes 406 having uniform diameter, as the respective diameter of each of pipes 406 may differ.

With continued reference to FIG. 4B, according to an embodiment, one or more of pipes 406 of sound-attenuation part 402 may comprise wadding 408 inserted therein. Use of wadding 408 in pipes 406 may serve to increase the sound damping capabilities of the sound-attenuation part 402. However, determination of the type and amount of wadding 408 used should consider the effect the wadding 408 would have on the airflow pressure loss through the pipes 406 and, therefore, should allow for enough airflow through the sound-attenuation part 402 for the desired system airflow and cooling purposes of the orifices 209 (FIGS. 2A, 2B) of the backplane 208 (FIGS. 2A, 2B, 3).

Figure 5A:
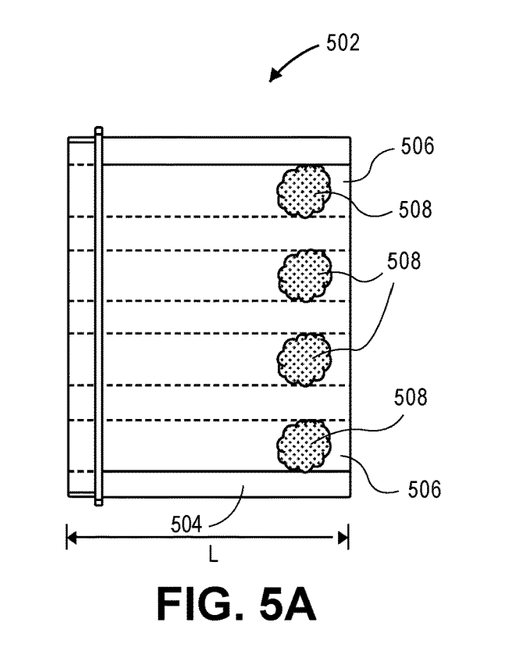
FIG. 5A is a first view illustrating a sound-attenuation part, according to an embodiment.
Figure 5B:
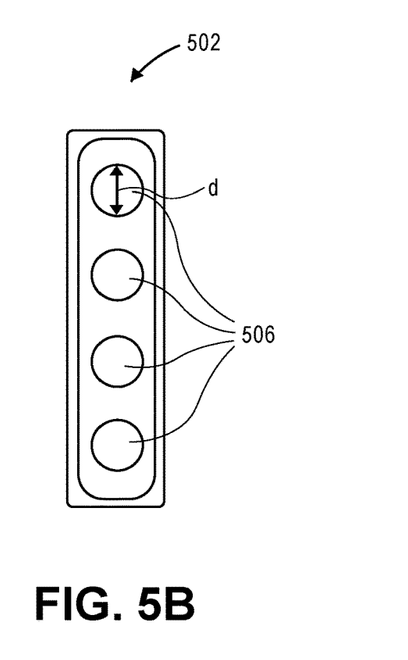
FIG. 5B is a second view illustrating the sound-attenuation part of FIG. 5A, according to an embodiment.

FIG. 5A is a first view illustrating a sound-attenuation part, and FIG. 5B is a second view illustrating the sound-attenuation part of FIG. 5A, both according to embodiments. Sound-attenuation part 502 comprises an elongated structure 504 and one or more holes 506 that extend therethrough. For example, sound-attenuation part 502 represents an embodiment of sound-attenuation part 302 (FIG. 3) of server 300 (FIG. 3). According to an embodiment, the sound-attenuation part 502 is structurally configured to mate with a corresponding orifice 209 (FIGS. 2A, 2B) of backplane 208 (FIGS. 2A, 2B, 3), such as by insertion of a portion of sound-attenuation part 502 similar to the mounting portion 404 (FIG. 4A) into a specific corresponding orifice 209. However, the manner in which each sound-attenuation part 502 is configured to couple with a corresponding orifice 209 may vary from implementation to implementation, such that the sound-attenuation part 502 operates to attenuate sound that may reach the set of DSDs 202 (FIGS. 2A, 2B, 3).

With reference to FIG. 3 and the configuration of the server 300 depicted therein, note that according to an embodiment, the elongated structure 504 and holes 506 of sound-attenuation part 502 extend in a direction away from the back of the backplane 208, which is also in the direction away from the DSDs 202, which is in the direction toward the fans 206. In determining a suitable length for the elongated structure 504, and thus the length of corresponding holes 506, similar considerations could be made as described in reference to sound-attenuation part 402 (FIGS. 4A, 4B). Thus, according to an embodiment, the length (L) of the elongated structure 504 and holes 506 is at least 20 mm (millimeters), a length that was found suitable for the intended purpose(s) described herein.

With reference to FIG. 5A, according to an embodiment, one or more of holes 506 of sound-attenuation part 502 may comprise wadding 508 inserted therein. Use of wadding 508 in the holes 506 may serve to increase the sound damping capabilities of the sound-attenuation part 502. However, determination of the type and amount of each wadding 508 used, and in how many of holes 506 such wadding 508 is used, should consider the effect the wadding 508 would have on the airflow pressure loss through the holes 506. Therefore, such determination should allow for enough airflow through the sound-attenuation part 502 for the desired system airflow and cooling purposes of the orifices 209 (FIGS. 2A, 2B) of the backplane 208 (FIGS. 2A, 2B, 3).

With reference to FIG. 5B, note that each of the holes 506 of sound-attenuation part 502 has a diameter (d) (e.g., inner diameter). In determining a suitable diameter for the holes 506, similar considerations could be made as described in reference to sound-attenuation part 402 (FIGS. 4A, 4B). Thus, according to an embodiment, the diameter (d) of the holes 506 is at least 2 mm (millimeters), a diameter that was found suitable for the intended purpose(s) described herein. Note that embodiments of sound-attenuation part 502 are not limited to holes 506 having uniform diameter, as the respective diameter of each of holes 506 may differ.

Method of Assembling a Computing System

Figure 6:
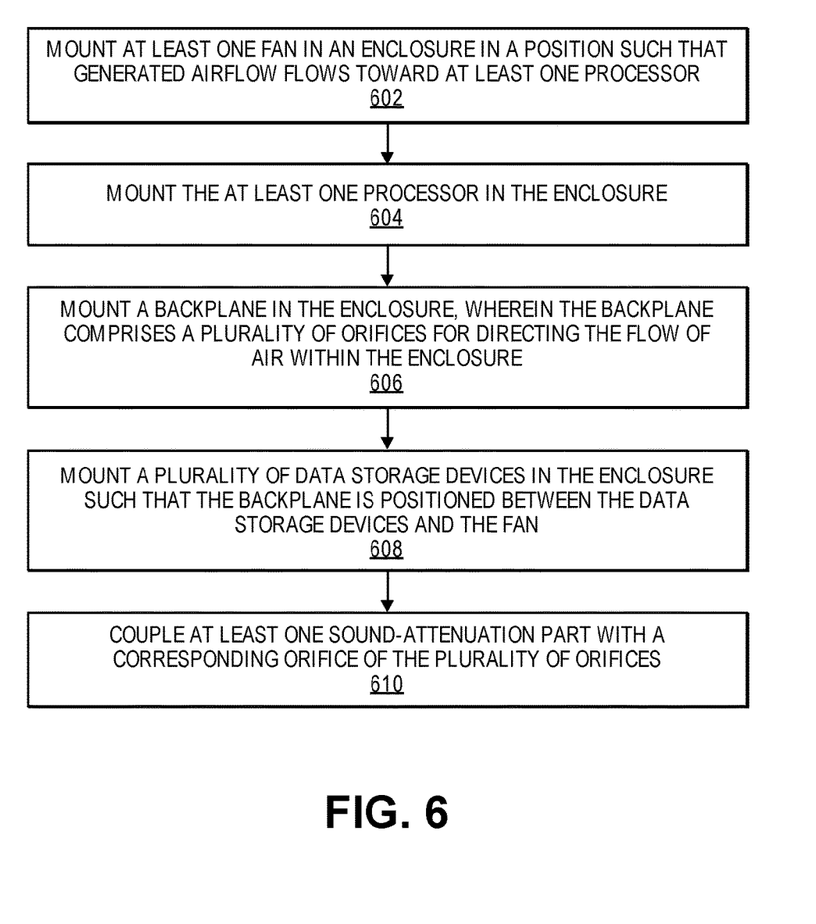
FIG. 6 is a flow diagram illustrating a process of assembling a computing system, according to an embodiment.

FIG. 6 is a flow diagram illustrating a process of assembling a computing system, according to an embodiment. For example, the process of FIG. 6 could be employed to assemble a computing system such as server 300 of FIG. 3. However, even though the following actions are described in a particular order, embodiments are not necessarily limited to any particular order of carrying out such actions.

At block 602, at least one fan is mounted in an enclosure, in a position such that airflow generated by the fan is directed toward and flows toward at least one processor. For example, one or more fans 206 (FIG. 3) are mounted in enclosure 201 (FIG. 3) of server 300 (FIG. 3), generating airflow toward a CPU unit 204 (FIG. 2A).

At block 604, the at least one processor is mounted in the enclosure. For example, CPU unit 204 (FIG. 2A) is mounted in enclosure 201 (FIG. 3) of server 300 (FIG. 3).

At block 606, a backplane is mounted in the enclosure, wherein the backplane comprises a plurality of orifices for directing the flow of air within the enclosure. For example, backplane 208 (FIG. 3) having orifices 209 (FIG. 2B) is mounted in enclosure 201 (FIG. 3) of server 300 (FIG. 3).

At block 608, a plurality of data storage devices is mounted in the enclosure, such that the backplane is positioned between the data storage device and the fan. For example, a plurality of DSDs 202 (FIG. 3) is mounted in the enclosure 201 (FIG. 3) of server 300 (FIG. 3) in front of the backplane 208 (FIG. 3), such that the backplane 208 is positioned between the DSDs 202 and the fan 206 (FIG. 3).

At block 610, at least one sound-attenuation part is coupled with a corresponding orifice of the plurality of orifices. For example, at least one sound-attenuation part 402 (FIGS. 4A, 4B) and/or sound-attenuation part 502 (FIGS. 5A, 5B) is inserted into a corresponding orifice 209 (FIG. 2B) of backplane 208 (FIG. 3).

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A rack-mount server comprising:
a plurality of data storage devices mounted in an enclosure;
at least one processor mounted in said enclosure spaced from said data storage devices;
at least one fan positioned between said data storage devices and said processor and configured for generating airflow for cooling said processor;
a backplane positioned between said data storage devices and said fan, wherein said backplane comprises a plurality of orifices for directing the flow of air within said enclosure; and
at least one sound-attenuation part structurally configured to mechanically mate with a corresponding orifice of the plurality of orifices and inserted into said corresponding orifice to attenuate noise from said fan passing through said corresponding orifice and said sound-attenuation part to said data storage devices, said sound-attenuation part comprising:
a mounting portion inserted into said corresponding orifice, and
an elongated portion extending from said mounting portion and comprising a plurality of circular orifices therethrough.

2. The rack-mount server of claim 1, wherein:
said corresponding orifice has a first cross-sectional area; and
said plurality of orifices of said sound-attenuation part through which air flows has a collective second cross-sectional area that is less than said first cross-sectional area.

3. The rack-mount server of claim 1, wherein said elongated portion of said sound-attenuation part extends from a back side of said backplane in a direction toward said fan.

4. The rack-mount server of claim 1, wherein said sound-attenuation part comprises:
a wadding in at least one of said plurality of orifices.

5. The rack-mount server of claim 1, wherein said sound-attenuation part comprises
one or more pipe parts extending from said mounting portion in a direction toward said fan.

6. The rack-mount server of claim 5, wherein said one or more pipes are at least 20 millimeters (mm) long.

7. The rack-mount server of claim 5, wherein said one or more pipes have a diameter of at least 2 millimeters (mm).

8. A method of assembling a computing system, the method comprising:
mounting at least one fan in an enclosure in a position such that generated airflow flows toward at least one processor;
mounting said at least one processor in said enclosure;
mounting a backplane in said enclosure, wherein said backplane comprises a plurality of orifices for directing the flow of air within said enclosure;
mounting a plurality of data storage devices in said enclosure such that said backplane is positioned between said data storage devices and said fan; and
coupling at least one sound-attenuation part, which is structurally configured to mechanically mate with a corresponding orifice of the plurality of orifices, with said corresponding orifice by inserting a mounting portion of said sound-attenuation part into said corresponding orifice to attenuate noise from said at least one fan passing through said corresponding orifice and said sound-attenuation part to said data storage devices, wherein said sound-attenuation part further comprises an elongated portion extending from said mounting portion and comprising a plurality of circular orifices therethrough.

9. The method of claim 8, wherein:
said corresponding orifice of said backplane has a first cross-sectional area;
said plurality of orifices of said sound-attention part, through which air flows, has a collective second cross-sectional area; and
said second cross-sectional area is less than said first cross-sectional area.

10. The method of claim 8, wherein coupling comprises coupling said sound-attenuation part comprising said elongated portion that extends from a back side of said backplane in a direction toward said fan.

11. The method of claim 8, wherein coupling comprises coupling said sound-attenuation part comprising a wadding in at least one of said one or more orifices of said sound-attenuation part.

12. The method of claim 8, wherein coupling comprises coupling said sound-attenuation part comprising
one or more pipe parts extending from said mounting portion in a direction toward said fan.

13. The method of claim 12, wherein said one or more pipes are at least 20 millimeters (mm) long.

14. The method of claim 12, wherein said one or more pipes have a diameter of at least 2 millimeters (mm).

15. The rack-mount server of claim 1, wherein said elongated portion of said sound-attenuation part is at least 20 millimeters (mm) long.

16. The rack-mount server of claim 1, wherein each of said plurality of circular orifices of said elongated portion of said sound-attenuation part has a diameter of at least 2 millimeters (mm).

17. A data storage system comprising:
means for generating airflow across at least one processor mounted in an enclosure;
means for directing said airflow within said enclosure;

means for positioning said means for directing between a plurality of data storage devices and said means for generating; and means for attenuating noise from said means for generating through said means for directing to said data storage devices, including:
- structural insertion means for mechanically mating said means for attenuating with said means for directing; and
- structural attenuation means extending from said structural insertion means.

18. The system of claim 17, wherein:

said means for directing includes first means for passing said airflow through said means for directing;

said first means for passing has a first cross-sectional area;

said means for attenuating noise includes second means for passing said airflow through said means for attenuating; and said second means for passing has a second cross-sectional area that is less than said first cross-sectional area.

19. The system of claim 17, further comprising:

means for sound damping positioned within said structural attenuation means of said means for attenuating noise.

* * * * *